(12) United States Patent
Franca-Neto

(10) Patent No.: US 6,429,742 B1
(45) Date of Patent: Aug. 6, 2002

(54) GAIN-CONTROLLED TUNED DIFFERENTIAL ADDER

(75) Inventor: Luiz M. Franca-Neto, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/896,524

(22) Filed: Jun. 29, 2001

(51) Int. Cl.[7] .................................................. H03F 3/45
(52) U.S. Cl. ........................................ 330/254; 327/359
(58) Field of Search ........................... 330/254; 327/359

(56) References Cited

U.S. PATENT DOCUMENTS

| | | | | |
|---|---|---|---|---|
| 4,646,348 A | * | 2/1987 | Jett, Jr. ...................... | 330/254 |
| 5,831,468 A | * | 11/1998 | Kimura ....................... | 327/359 |
| 6,094,084 A | * | 7/2000 | Abou-Allam et al. ....... | 327/359 |
| 6,100,760 A | * | 8/2000 | Maruyama et al. ......... | 330/254 |

* cited by examiner

Primary Examiner—Michael B Shingleton
(74) Attorney, Agent, or Firm—Schwegman, Lundberg, Woessner & Kluth, P.A.

(57) ABSTRACT

A gain-controlled tuned differential adder, a transmitter, and a receiver are described. The gain-controlled, tuned differential amplifier includes first and second differential amplifiers with differential input nodes, and common differential output nodes. A variable AC load, as part of an AGC circuit, is connected between the common differential output nodes. A pair of inductors are connected to the output nodes, and can be selected, in combination with the total diffusion capacitance of transistors within the first and second differential amplifiers and the variable AC load, so as to limit operation of the amplifier to a desired, tunable frequency.

22 Claims, 2 Drawing Sheets

GAIN-CONTROLLED TUNED DIFFERENTIAL ADDER

RELATED PATENTS

This application is related to co-pending application Ser. No. 09/711,332, filed on Nov. 9, 2000, entitled "Electrically Tuned Integrated Amplifier for Wireless Communications", which is commonly assigned to the assignee of the present invention. This application is also related to co-pending application Ser. No. 09/712,453, filed on Nov. 14, 2000, entitled "Method and Apparatus for Performing DC Offset Cancellation in a Receiver", also commonly assigned to the assignee of the present invention.

FIELD OF THE INVENTION

The present invention relates generally to apparatus used for reception and transmission of radio frequency signals. More particularly, the present invention relates to apparatus which are used to selectively add and amplify differential signals while maintaining control over the output gain.

BACKGROUND INFORMATION

The demand for more sophisticated communications equipment has increased exponentially in response to the popularity of cellular telephones, personal computers, and the internet. To keep up with this demand, mixed-signal (analog and digital) designs have become more prevalent in the manufacture of integrated circuits.

Several problems arise in such designs, one of the most difficult being the hostile environment created by the relatively large transitions of digital signals between the voltage supply and ground rails at rates which are usually considered to be in the realm of radio frequencies. Attempting to simultaneously receive and process relatively weak radio-frequency (RF) signals within the confines of a typical desktop personal computer, or using Personal Digital Assistant (PDA) chassis, for example, may thus present a very difficult design challenge. This is readily apparent when consideration is given to the fact that current high-end microprocessor clock speeds exceed 1 Ghz, while cellular telephones and other wireless devices commonly operate in the frequency range of 0.9 to 1.8 Ghz.

Differential amplifier circuits, which receive two input signals and provide an output signal which is a function of the difference between the input signals, are sometimes used to reduce the effects of noise on desired signals. As an example, one type of differential amplifier in the prior art includes first and second n-channel field effect transistors (NFET transistors), referred to as a differential pair. The input signals, Vin+ and Vin−, are received at the gates of the first and second nFET transistors, respectively. If first and second loads are connected between the drains of the first and second nFET transistors, respectively, and a single power supply, the output signals Vout+ and Vout− will appear at the drains of the first and second NFET transistors, respectively. The sources of the first and second nFET transistors are typically coupled to ground through a third nFET transistor, which serves as a source of bias current.

If the first and second loads are matched, and the first and second nFET transistors are matched, the difference between Vout+ and Vout− is a function of the difference between Vin+ and Vin−. In this way, the differential amplifier suppresses or rejects voltages which are included in both input signals. Examples of suppressed voltages include a DC offset voltage and noise appearing on both input signals. This suppression is referred to as common mode rejection, and can be a very useful way of increasing the effectiveness of weak signal reception. Thus differential topologies are highly desired for use within mixed-signal designs.

Universal RF front-end design often requires the use of in-phase and quadrature components for both transmitted and received signals. These signals are often mixed and added at different stages of the signal reception and transmission process, for example, to generate various types of modulation (e.g., amplitude modulation, frequency modulation, phase modulation, frequency-shift keying, phase-shift keying, etc.). As noted above, differential signal processing within RF circuitry provides a way of producing more robust designs, giving increased protection from common mode noise coupled in from nearby, purely-digital, circuitry. When multiple circuit modules are cascaded in a signal processing chain, it is also desirable to make use of automatic gain control (AGC) as a way of conveniently adjusting the output of such "building blocks" or modules within a particular RF design, such as a transceiver, so that subsequent amplification stages are not over-driven.

Thus, there is a need in the art for apparatus which foster the use of differential signal processing within the fundamental modules used in mixed-signal RF circuit design, such as mixers, adders, and amplifiers. Such apparatus should also provide RF designers with the ability to use AGC, along with other techniques which can be used to decrease the strength of unwanted (out-of-band) signals before they enter the signal processing chain. Such apparatus are most useful in furnishing the type of analog RF circuit design tools capable of functioning effectively within the hostile signal environment present in sophisticated modern mixed-signal communications equipment.

DESCRIPTION OF THE PREFERRED EMBODIMENTS

Figure 1:
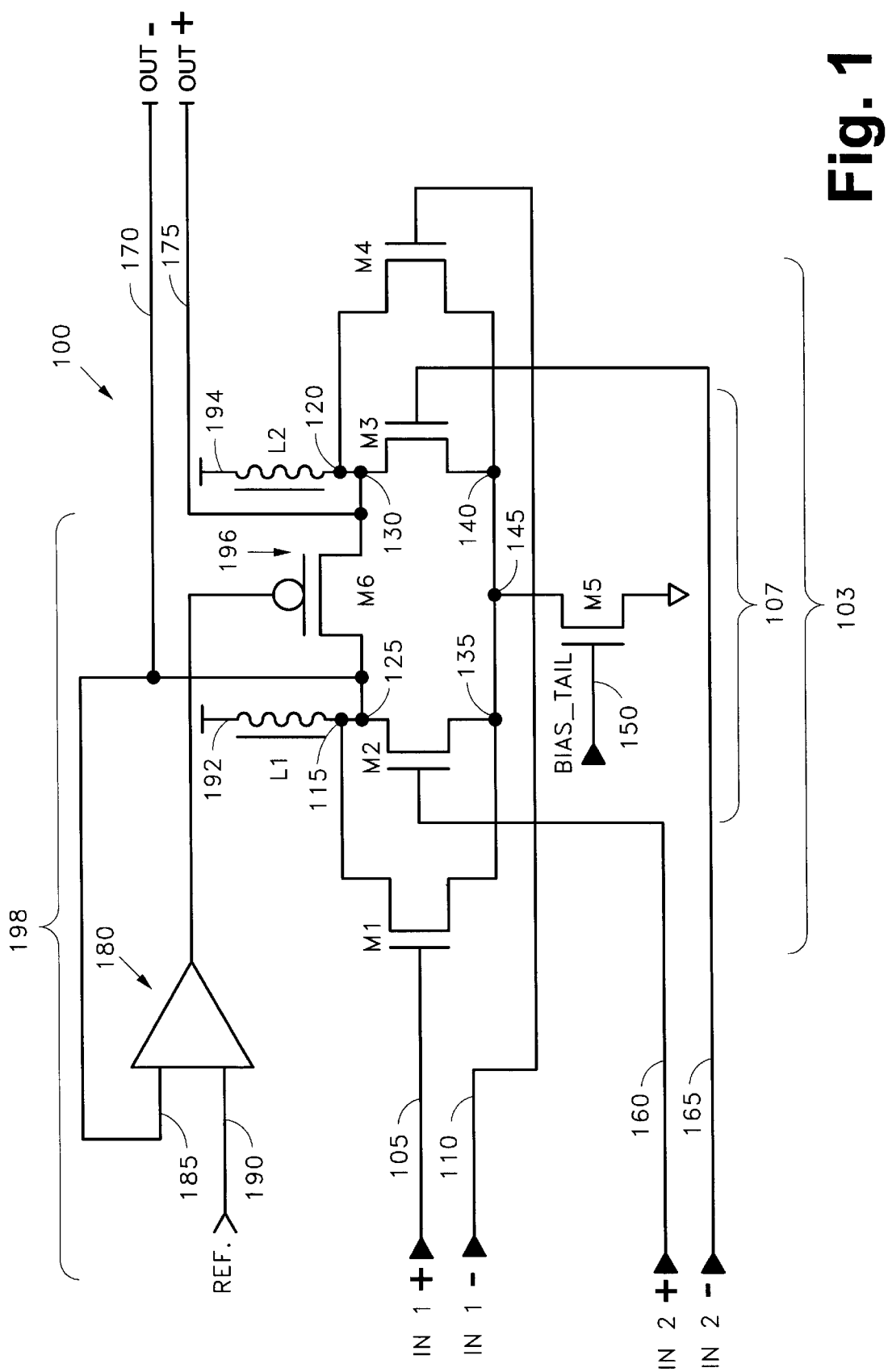
FIG. 1 is a schematic diagram of a gain-controlled tuned differential adder constructed according to the teachings of the present invention.

In the following detailed description of the preferred embodiments, reference is made to the accompanying drawings which form a part hereof, and in which are shown by way of illustration, and not of limitation, specific embodiments in which the invention may be practiced. In the drawings, like numerals describe substantially similar components throughout the several views. The embodiments illustrated are described in sufficient detail to enable those skilled in the art to practice the invention. Other embodiments may be utilized and derived therefrom, such that structural, logical, and electrical circuit substitutions and changes may be made without departing from the scope of the invention. The following detailed description, therefore, is not to be taken in a limiting sense, and the scope of the invention is defined only by the appended claims, along with the full range of equivalents to which such claims are entitled.

The present invention teaches a gain-controlled tuned differential adder, including first and second differential tuned amplifiers with separate differential input nodes and commonly-connected differential output nodes. A direct-current (DC) shunting AGC circuit is connected between the differential output nodes, such that the fully-differential, gain-controlled adder of the present invention provides the advantages of differential signal processing with gain control that does not affect the bias of the resulting amplified signal at the output nodes. A pair of inductors are also connected to the output nodes, and can be selected, in combination with the diffusion capacitance of transistors within the first and second differential amplifiers and the AGC circuit, so as to limit the operation of the adder to a desired frequency, or band of frequencies, reducing extraneous signal content at the differential output nodes.

FIG. 1 shows a schematic diagram of a gain-controlled tuned differential adder constructed according to the teachings of the present invention can be seen. The gain-controlled tuned differential adder 100 includes a first differential amplifier 103 with first differential input nodes 105, 110 and differential output nodes 115, 120. The first differential input nodes 105, 110 are coupled to the gates of a first differential pair of transistors M1, M4, respectively. The gain-controlled tuned differential adder 100 also includes a second differential amplifier 107 with second differential input nodes 160, 165 and differential output nodes 125, 130. The second differential input nodes 160, 165 are coupled to a second differential pair of transistors M2, M3, respectively.

The first and second amplifiers 103, 107 are typically fabricated on a single substrate, and thus are matched to one another so as to have substantially the same gain. In addition, the first and second amplifiers 103, 107 each typically include first and second matched portions for amplifying each of the corresponding differential input signal components. For example, the first amplifier 103 includes a first portion (transistor M1) to amplify the differential input signal component from the differential input node 105, and a second portion (transistor M4) to amplify the differential input signal component from the differential input node 110. Similarly, the second amplifier 107 includes a first portion (transistor M2) to amplify the differential input signal component from the differential input node 160 and a second portion (transistor M3) to amplify the differential input signal component from the differential input node 165.

As illustrated, the output of the first portion of the first amplifier 103 is connected to the differential output node 115 and the output of the second portion of the first amplifier 103 is connected to the differential output node 120. The output of the first portion of the second amplifier 107 is connected to the differential output node 125 (commonly connected to the differential output node 115) and the output of the second portion of the second amplifier 107 is connected to the differential output node 130 (commonly connected to the differential output node 120). Since the source of bias current M5 typically operates in saturation, as a constant current source, common-mode noise present on the differential input nodes 105, 110 will be substantially reduced or eliminated at the differential output nodes 115, 120 because the sum of the currents through the first differential pair of transistors M1, M4 is forced to remain substantially constant. Similarly, common-mode noise present on the differential input nodes 160, 165 will be substantially reduced or eliminated at the differential output nodes 115, 120 because the sum of the currents through the second differential pair of transistors M2, M3 is forced to remain substantially constant. Finally, the output of the amplifiers 103, 107 will combine together at the common differential output nodes 115, 120 to provide a differential output signal which is the sum of the differential input signals present at the differential input nodes 105, 110 and the differential input nodes 160, 165, times the gain (G) of the adder 100. Those skilled in the art will realize that inverting the position of the signals in2+ and in2− with respect to the differential input nodes 160, 165 (i.e., connecting the in2+ signal to the input node 165, and the in2− signal to the input node 160), for example, will result in a combined differential output signal of the amplifiers 103, 107 which is the difference of the differential input signals present at the differential input nodes 105, 110 and the differential input nodes 160, 165, times the gain (G) of the adder 100.

An AGC circuit 198 includes a controlled variable alternating current (AC) load 196 connected between the differential output nodes 115, 120 of the first differential amplifier 103, and a controlling element in the form of a comparator 180. The AGC circuit 198 automatically adjusts the gain of the adder 100 because the load 196 connects two nodes 115, 120 which typically operate at the same DC bias level. Therefore, the DC bias level associated with the differential output nodes 115, 120 remains unchanged throughout the operational range of the AGC circuit 198. The reference voltage value 190 used by the comparator 180 is usually selected so that the output of the adder 100 will not over-dive subsequent amplification stages which may be coupled to the differential output nodes 115, 120. Thus, if a signal on one or both of the differential output nodes 115, 120 is too high (i.e. greater than the reference 190), the AGC circuit 198 will operate to reduce the output level of the adder 100 to an acceptable level, using the comparator 180 to change the amount of loading presented by the controlled variable AC load 196. Those skilled in the art will note that the device M6 is shown as a p-channel metal oxide semiconductor (PMOS) transistor by way of illustration, and not of limitation. Thus, n-channel metal oxide semiconductor (PMOS) transistors may also be used.

The AGC circuit 198 can thus be pre-configured to operate as a selector of different gain levels for the adder 100. That is, by switching between various preselected reference signal 190 levels, various levels of gain for the adder 100 can thereby be selected. The ability to change the gain of the adder 100 at will is most useful, for example, when the adder 100 is coupled to a power amplifier that selectively operates as a Class A power amplifier (providing good linearity, and lower efficiency), and as a Class E power amplifier (e.g. when more efficiency is needed, and linearity is less important, such as for frequency-shift keying).

A pair of inductors L1, L2 is also connected to the common differential output nodes 115, 120. Selecting one of the first differential pair of transistors (M1), and one of the second differential pair of transistors (M2), along with the transistor (M6) as the controlled variable AC load 196 provides a total diffusion capacitance value which combines with the inductance value of the inductor L1 to produce a resonant filter. Thus, the adder 100 can be tuned, using the combined diffusion capacitance value and selected inductance value, to pass an approximate preselected frequency, or band of frequencies. Tuning the adder 100 in this way serves to reject unwanted (i.e., out-of-band) frequencies present at the positive differential input nodes 105, 160.

Similarly, selecting one of the second differential pair of transistors (M3), and one of the first differential pair of transistors (M4), along with the transistor (M6) as the controlled variable AC load 196 provides a total diffusion capacitance value which, when combined with the inductance value of the inductor L2 produces another resonant filter. This second tuned filter serves to reject unwanted frequencies present at the negative differential input nodes 110, 165.

On some occasions, manufacturers fabricate transistors so as to make a connection to the transistor body available as a connection to an integrated circuit. In such cases, it should be noted that the application of a variable voltage to the body of transistors M1, M2, M3, and M4 can be used to change the capacitance associated with these transistors, and thus serves as a mechanism for fine-tuning the resonant frequency ($\omega$) of the adder 100.

Typically, the pair of inductors L1, L2 will be matched (i.e., each inductor L1, l2 will be selected to have an approximately equal inductance value), in accordance with matching the diffusion capacitance values of transistors M1, M2, M3, and M4. This will result in approximately matching preselected tuning frequencies for the common differential output nodes 115, 120. Assuming such substantially matching elements, the gain (G) of the adder 100 is approximately equal to the transconductance of transistor M1 ($g_m$) times the resistance of the parallel combination of: the differential output load resistance $r_{load}$ (which is the variable AC load 196 resistance provided by the transistor M6 and controlled by the AGC circuit 198), one-half of the transistor M1 output resistance ($r_o$), and the product of the inductor L1 quality factor (Q), the first differential amplifier 103 resonant frequency ($\omega$), and the inductance of inductor L1 (L), or:

$$G = g_m * [r_{load} \| r_o/2 \| Q\omega L].$$

The gain-controlled tuned differential adder 100 may also include a source of bias current M5 coupled to the first and second differential amplifiers 103 and 107. The source of bias tail current at the gate 155 is usually designed so that a substantially fixed current is supplied by the source of bias current to the common juncture 145 of the first and second differential amplifiers 103 and 107. Those skilled in the art will note that, as shown in FIG. 1, the first and second differential pair of transistors M1, M4 and M2, M3, as well as the source of bias current M5 are shown, by way of illustration, and not limitation, to be n-channel metal oxide semiconductor (NMOS) transistors. Thus, PMOS transistors may also be used. It should also thus be noted that the adder 100 may be fabricated using complementary metal-oxide-semiconductor (CMOS) formation techniques. Preferably, the entire amplification circuit 100, including the comparator 180, will be formed on a single substrate, or fabricated so as to reside within a single semiconductor integrated circuit package.

Figure 2:
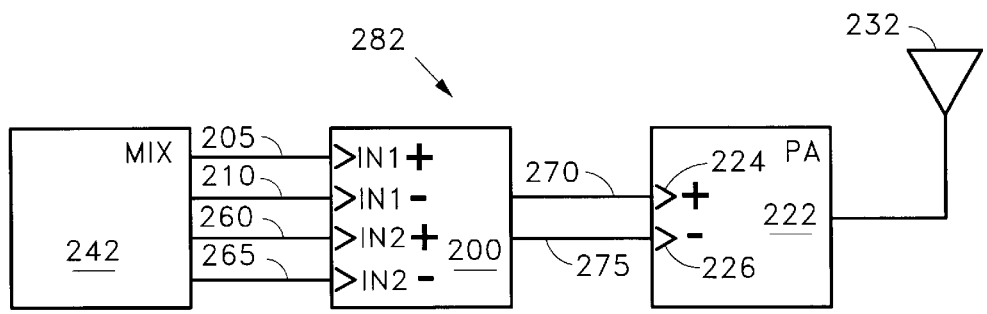
FIG. 2 is a schematic block diagram of a transmitter constructed according to the teachings of the present invention.

FIG. 2 shows a schematic block diagram of a transmitter constructed according to the teachings of the present invention. The transmitter 282 includes a radio frequency antenna 232 coupled to a power amplifier 222, which is in turn coupled to a gain-controlled tuned differential adder 200 constructed according to the teachings of the present invention. The gain-controlled tuned differential adder 200 includes a first differential amplifier with first differential input nodes 205, 210 and a second differential amplifier having second differential input nodes 260, 265. The differential output nodes 270, 275 of the first and second differential amplifiers are connected together, as well as to the power differential input 224, 226 of the power amplifier 222. As noted above, a pair of inductors is connected to the differential output nodes 270, 275, and a controlled variable AC load, included as part of an AGC circuit, is connected between the differential output nodes 270, 275.

As described above, transistors within the first and second differential amplifiers, along with a transistor in the AGC circuit (i.e., the controlled variable AC load) combine to provide a total diffusion capacitance value which can be joined with the inductance of one or both of the inductors to filter or pass an approximate preselected frequency. This results in tuning the adder 200 to operate on a narrow band of frequencies at or about the resonant frequency. The AGC circuit also automatically adjusts the gain of the adder 200 without changing the bias level associated with the differential output nodes 270, 275 of the first and second differential amplifiers connected to the power amplifier 222.

Those skilled in the art will note that the amplfier 200 can be directly cascaded with one or more other amplification circuits to achieve additional gain. Such other amplification circuits can also be formed on the same substrate as the adder 200. Furthermore, as shown in FIG. 2, additional transmitter circuitry, such as a mixer 242, coupled to the first and second differential inputs 205, 210 and 260, 265, respectively, of the adder 200, can also be used in the transmitter 282, and formed on the same substrate, or within a single integrated circuit chip, if desired. As is well known by those skilled in the art, the block diagram of the transmitter 282 can be augmented or changed to include other circuitry commonly used in transmitters or transceivers, including, for example, a modulator.

Figure 3:
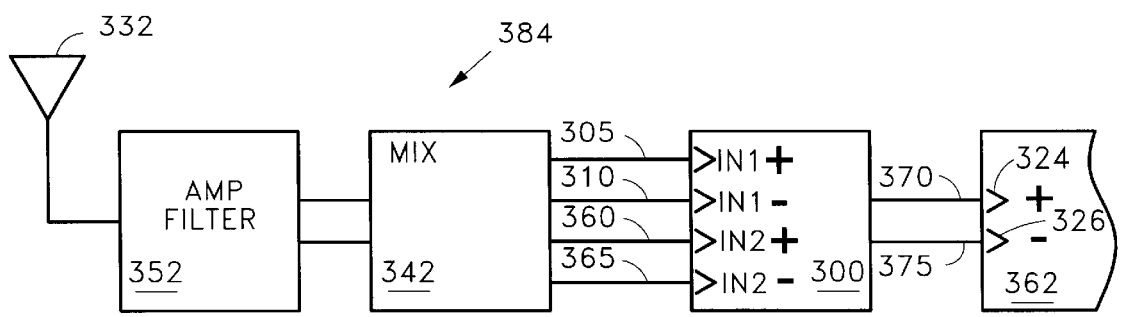
FIG. 3 is a schematic block diagram of a receiver constructed according to the teachings of the present invention.

FIG. 3 shows a schematic block diagram of a receiver constructed according to the teachings of the present invention. The receiver 384 includes a radio frequency antenna 332 coupled to one or more amplifiers and/or filters 352, which are in turn coupled to one or more mixers 342. The mixer(s) 342 is/are coupled to a gain-controlled tuned differential adder 300 via first and second differential output nodes coupled to the first and second differential input nodes 305, 310 and 360, 365 of the adder 300, respectively.

As the gain-controlled tuned differential adder 300 is constructed according to the teachings of the present invention, the adder 300 includes a first differential amplifier with first differential input nodes 305, 310 and a second differential amplifier with second differential input nodes 360, 365. The differential output nodes 370, 375 of the first and second differential amplifiers are connected together, as well as to the detection differential input 324, 326 of the detector 362 (e.g., a demodulator). As noted above, a pair of inductors are connected to the differential output nodes 370, 375, and an AGC circuit is connected between the differential output nodes 370, 375.

In addition, as noted previously, the diffusion capacitance of selected transistors within the first and second differential amplifiers, along with a transistor in the AGC circuit (i.e., the controlled variable AC load), combine to provide a total diffusion capacitance value which resonates with one or both of the inductors at some approximate preselected frequency. The inductor pair is typically matched, such that each one of the inductors may be selected to have approximately the same inductance value as the other. The AGC circuit automatically adjusts the gain of the adder 300 without changing the bias level associated with the differential output nodes 370, 375 of the first and second differential amplifiers connected to the detector 362. As described with respect to the adder 100 of FIG. 1, the adder 300 of FIG. 3 may include an AGC circuit that has a variable impedance device (e.g. an NMOS transistor) connected to a comparator which senses one of the output signal levels present at the differential output nodes 370, 375 in order to provide feedback which adjusts a signal to change the impedance of the device.

Those skilled in the art will note that the adder 300 can be directly cascaded with one or more other amplification circuits to achieve additional gain. Such other amplification circuits can also be formed on the same substrate as the adder 300. As is also well known to those skilled in the art, the block diagram of the receiver 384 can be augmented or changed to include other circuitry commonly used in receivers or transceivers. Such additional receiver circuitry can also be formed as a part of the same substrate, or within a single integrated circuit chip. As described above, the adder 300 may include a constant-current bias source coupled to the first and second differential amplifiers.

Those of ordinary skill in the art will also understand that the embodiments shown in FIGS. 1–3 illustrate gain-controlled tuned differential adders, transmitters, and receivers which include first and second differential amplifiers that have differential input nodes and differential output nodes, wherein the differential output nodes of each amplifier are connected together. A pair of selectable, resonating inductors are connected to the common differential output nodes, and a controlled variable AC load, as part of an AGC circuit, is connected between the differential output nodes. Thus, one of ordinary skill in the art will understand, upon reading this description, that the amplification circuitry of the present invention can be used in applications other than for gain-controlled, tuned differential adders, transmitters, and receivers, and thus, the invention is not to be so limited. The illustrations of a gain-controlled tuned differential adder 100, 200, and 300 in FIGS. 1–3, as well as the transmitter of FIG. 2, and the receiver of FIG. 3 are intended to provide a general understanding of some applications which may be served by the structure and circuitry of the present invention, and are not intended to serve as a complete description of all the elements and features of circuitry and/or communications systems which might possibly make use of the novel amplification circuitry and systems described herein.

Applications which may include the novel amplification circuitry of the present invention as described in this document include electronic circuitry used in high-speed computers, arrays of memory modules and other circuit cards, device drivers, power modules, communication circuitry, modems, processor modules, memory integrated circuits, embedded processors, and application-specific modules, including multilayer, multi-chip modules. Such circuitry may further be included as sub-components within a variety of electronic systems, such as televisions, cellular telephones, personal computers, aircraft, and others. Those of ordinary skill in the art will also realize that various elements of the gain-controlled tuned differential adders, transmitters, and receivers of the present invention may be assembled and used in accordance with the structures described in the various figures.

Thus, the present invention provides a novel tunable, gain-controlled, tuned differential adder circuit, a transmitter, and a receiver. The invention provides the mixed-signal circuit designer with a powerful tool for summing and amplifying signals using a differential topology. The output gain of the amplifier is controlled using the AGC circuit such that cascaded stages coupled to the amplifier output will not be over-driven. Finally, the gain-controlled, differential amplifier of the present invention is tunable, which serves to remove undesired, out-of-band signals as an integral part of the differential signal amplification and summation process.

Although specific embodiments have been illustrated and described herein, it will be appreciated by those of ordinary skill in the art that any arrangement which is calculated to achieve the same purpose may be substituted for the specific embodiments shown. This application is intended to cover any and all adaptations or variations of the present invention. It is to be understood that the above description has been made in an illustrative fashion, and not a restrictive one. Combinations of the above embodiments, and other embodiments not specifically described herein will be apparent to those of skill in the art upon reviewing the above description. The scope of the invention includes any other applications in which the above structures and circuitry are used. The scope of the invention should be determined with reference to the appended claims, along with the full range of equivalents to which such claims are entitled.

What is claimed is:

1. A gain-controlled tuned differential adder, comprising:
   a first differential amplifier having first differential input nodes and differential output nodes, the first differential input nodes being coupled to a first differential pair of transistors;
   a second differential amplifier having second differential input nodes and differential output nodes connected to the differential output nodes of the first differential amplifier, the second differential input nodes being coupled to a second differential pair of transistors;
   a variable alternating current (AC) load connected between the differential output nodes of the first differential amplifier; and
   a pair of inductors connected to the differential output nodes of the first differential amplifier.

2. The gain-controlled tuned differential adder of claim 1, wherein the first and second differential pair of transistors are NMOS transistors.

3. The gain-controlled tuned differential adder of claim 1, wherein a selected one of the first differential pair of transistors, a selected one of the second differential pair of transistors, and a transistor included within the variable AC load have a first combined diffusion capacitance value, and wherein a selected one of the pair of inductors has an inductance value selected to resonate with the first combined diffusion capacitance value at approximately a preselected frequency.

4. The gain-controlled tuned differential adder of claim 3, wherein a selected other one of the first differential pair of transistors, a selected other one of the second differential pair of transistors, and the transistor within the variable AC load have a second combined diffusion capacitance value, and wherein a selected other one of the pair of inductors has an inductance value selected to resonate with the second combined diffusion capacitance value at approximately the preselected frequency.

5. The gain-controlled tuned differential adder of claim 1, wherein each one of the pair of inductors has an approximately equal inductance value.

6. The gain-controlled tuned differential adder of claim 1, further including:
   a source of bias current coupled to the first and second differential amplifiers.

7. The gain-controlled tuned differential adder of claim 6, wherein the source of bias current supplies a fixed current to the first and second differential amplifiers.

8. The gain-controlled tuned differential adder of claim 6, wherein the source of bias current is a transistor.

9. The gain-controlled tuned differential adder of claim 1, further including:
   an AGC circuit which automatically adjusts a gain of the gain-controlled tuned differential adder without changing a bias level associated with the differential output nodes of the first differential amplifier.

10. The gain-controlled tuned differential adder of claim 1, wherein the variable AC load includes a variable impedance device connected to a comparator which senses an output signal level at the first differential output nodes and adjusts a signal which changes an impedance of the variable impedance device.

11. The gain-controlled tuned differential adder of claim 1, wherein a gain of the gain-controlled tuned differential adder is approximately equal to a transconductance of a selected one of the first differential pair of transistors times a resistance of a parallel combination of a differential output load resistance of the variable AC load, one-half of an output resistance of the selected one of the first differential pair of transistors, and the product of a quality factor of a selected one of the pair of inductors, a resonant frequency of the first differential amplifier, and an inductance of the selected one of the pair of inductors.

12. A transmitter, comprising:
   a power amplifier having a power differential input; and
   a gain-controlled tuned differential adder comprising:
      a first differential amplifier having first differential input nodes and first differential output nodes, the first differential input nodes being coupled to a first differential pair of transistors;
      a second differential amplifier having second differential input nodes and second differential output nodes connected to the first differential output nodes, the second differential input nodes being coupled to a second differential pair of transistors;
      a variable alternating current (AC) load connected between the first differential output nodes; and
      a pair of inductors connected to the first differential output nodes and the power differential input.

13. The transmitter of claim 12, wherein a selected one of the first differential pair of transistors, a selected one of the second differential pair of transistors, and a transistor included within the variable AC load have a first combined diffusion capacitance value, and wherein a selected one of the pair of inductors has an inductance value selected to resonate with the first combined diffusion capacitance value at approximately a preselected frequency.

14. The transmitter of claim 13, further including:
   an AGC circuit which automatically adjusts a gain of the gain-controlled tuned differential adder without changing a bias level associated with the differential output nodes of the first differential amplifier.

15. A receiver, comprising:
   a mixer having a first and second mixer differential output; and
   a gain-controlled tuned differential adder coupled to the mixer, the gain-controlled tuned differential adder comprising:
      a first differential amplifier having first differential input nodes and first differential output nodes, the first differential input nodes being coupled to a first differential pair of transistors and the first mixer differential output;
      a second differential amplifier having second differential input nodes and second differential output nodes connected to the first differential output nodes, the second differential input nodes being coupled to a second differential pair of transistors and the second mixer differential output;
      a variable alternating current (AC) load connected between the first differential output nodes, and
      a pair of inductors connected to the first differential output nodes.

16. The receiver of claim 15, wherein a selected one of the first differential pair of transistors, a selected one of the second differential pair of transistors, and a transistor included within the variable AC load have a first combined diffusion capacitance value, and wherein a selected one of the pair of inductors has an inductance value selected to resonate with the first combined diffusion capacitance value at approximately a preselected frequency.

17. The receiver of claim 16, wherein a selected other one of the first differential pair of transistors, a selected other one of the second differential pair of transistors, and the transistor within the variable AC load have a second combined diffusion capacitance value, and wherein a selected other one of the pair of inductors has an inductance value selected to resonate with the second combined diffusion capacitance value at approximately the preselected frequency.

18. The receiver of claim 15, wherein each one of the pair of inductors has an approximately equal inductance value.

19. The receiver of claim 15, further including:
   a constant-current bias source coupled to the first and second differential amplifiers.

20. The receiver of claim 15, further including:
   an AGC circuit which automatically adjusts a gain of the gain-controlled tuned differential adder without changing a bias level associated with the differential output nodes of the first differential amplifier.

21. The receiver of claim 15, wherein the variable AC load includes a variable impedance device connected to a comparator which senses an output signal level at the first differential output nodes and adjusts a signal which changes an impedance of the variable impedance device.

22. The receiver of claim 21, wherein the variable impedance device is a transistor.

* * * * *